United States Patent [19]
Mozdzen

[11] Patent Number: 6,020,631
[45] Date of Patent: Feb. 1, 2000

[54] METHOD AND APPARATUS FOR CONNECTING A BONDWIRE TO A BONDRING NEAR A VIA

[75] Inventor: Thomas J. Mozdzen, Gilbert, Ariz.

[73] Assignee: Intel Corporation, Santa Clara, Calif.

[21] Appl. No.: 09/003,116

[22] Filed: Jan. 6, 1998

[51] Int. Cl.⁷ .................................................. H01L 23/52
[52] U.S. Cl. ............................ 257/691; 257/701; 257/786
[58] Field of Search ..................................... 257/691, 778, 257/701, 702, 672, 786

[56] References Cited

U.S. PATENT DOCUMENTS 5,483,099  1/1996  Natarajan et al. ...................... 257/691
5,723,899  3/1998  Shin ........................................ 257/691

*Primary Examiner*—Carl Whitehead, Jr.
*Assistant Examiner*—Roy Potter
*Attorney, Agent, or Firm*—Cindy T. Faatz

[57] ABSTRACT

An integrated circuit device package. The package includes a package substrate having a conductive bondring disposed thereon. A via is electrically coupled to the bondring. A conductive bondring extension is also disposed on the package substrate. The bondring extension is electrically coupled to the bondring and the via and extends away from the bondring and the via.

10 Claims, 3 Drawing Sheets

METHOD AND APPARATUS FOR CONNECTING A BONDWIRE TO A BONDRING NEAR A VIA

FIELD OF THE INVENTION

The present invention relates generally to the field of integrated circuit device packages, and more particularly, to connections between an integrated circuit die and a bondring on a package substrate.

BACKGROUND OF THE INVENTION

As computer systems and other types of systems provide increased functionality in smaller form factors, there is a continuing demand for smaller integrated circuit devices. A key factor in determining the size of an integrated circuit device is the package in which an integrated circuit die is provided.

Certain types of integrated circuit device packages have been designed to be small relative to the size of the corresponding integrated circuit die while still providing a relatively large number of input/output terminals. Such packages include ball grid array packages, column grid array packages, and land grid array packages, for example.

Smaller integrated circuit packages that include a large number of input/output terminals can present many challenges for package designers. In particular, designing and routing connections between bondpads on the integrated circuit die and corresponding terminals on a package can be very difficult. The routing must be provided in a small amount of space and must provide for signals communicated via the routing to meet signal quality requirements. Additionally, in some cases, there may be more bondpads on the integrated circuit die than there are terminals on the package.

To illustrate some of the above issues, portions of a ball grid array (BGA) package 100 are shown in FIGS. 1 through 3. Referring first to FIG. 1, a partial top view of a package substrate 101 is shown. An integrated circuit die 105 is mounted to the package substrate 101. A power bus bondring 110, a ground paddle 115 and bondfingers 120 are disposed on the package substrate 101. The ground paddle 115 extends beneath the integrated circuit die 105 to provide multiple ground connections. Conductive traces typically extend from the bondfingers 120 to route signal connections to a corresponding terminal located on an opposite side of the package substrate, but are not shown in FIGS. 1 or 2 for purposes of clarity.

The power bus bondring 110 is provided on the package substrate 101 of FIG. 1 instead of discrete power bondfingers or other types of discrete power connections. The power bondring 110 helps to increase electrical performance of the package 100 by enabling the use of relatively short power bondwires.

Additionally, the power bondring 110 is provided because there may not be enough available terminals for each of several power bondpads on the integrated circuit die 105 (shown in FIG. 3). The power bondring 110 allows a first number of power bondwires to be electrically coupled to the power bondring 110. The power bondring 110, however, is electrically coupled to a smaller number of power terminals on an opposite side of the package substrate.

FIG. 2 shows a partial cross-section of the package substrate 101 and the integrated circuit die 105 taken at the line 2—2. Referring to FIGS. 1 and 2, vias 125 are provided at various points around the power bondring 110 to electrically connect the power bondring 110 to power terminals 205 on an opposite side of the package substrate 101. As shown in FIG. 2, the vias 125 extend through the package substrate 101 to conductive traces or terminal pads 210 that are electrically coupled to corresponding terminals 205. A minimum number of vias 125 corresponding to power terminals 205 may be necessary to ensure that signal quality requirements are met and/or to ensure that power supply or other electrical requirements are met.

FIG. 3 shows a portion of the package substrate 101 and the integrated circuit die 105 in more detail. While the vias 125 are used to connect the power bondring 110 to power terminals 205 on the package substrate 101, they may interfere with power connections from the integrated circuit die 105 to the power bondring 110. As shown in FIG. 3, the integrated circuit die 105 includes bondpads 305. Most of the bondpads 305 are electrically coupled either to the power bondring 110 or to signal bondfingers 120 by corresponding bondwires 310. The bondwires 310 are separated from each other by at least a minimum amount of space to prevent electrical shorts or other issues during encapsulation. The minimum amount of space depends on several factors including the diameter of the wire, and the encapsulation process used.

The bondpads 315 in the example shown in FIG. 3 are power bondpads. The bondpads 315, however, cannot be bonded to the power bondring 110 because of the location of the via 125. Referring to FIGS. 2 and 3, vias such as the via 125 are typically formed by drilling a hole in the package substrate 101 and filling the hole with conductive material. Bonding a bondwire 310 to the via 125 can cause the via 125 to become unstable or loose. As a result, the quality of the power signal and/or the integrity of the package connections may be compromised.

Referring again to FIG. 1, one approach to resolving this issue is to move the vias 125 to other locations along the power bondring 110 in an attempt to avoid having the vias 125 opposite any power bondpads on the integrated circuit die 105. Package designers, however, have little flexibility in terms of where on the power bondring 110 to locate the vias 125. Just as it is undesirable to bond bondwires to vias, it is also undesirable to have a via on one surface of the package substrate directly opposite a power terminal on the opposite side of the package substrate. It is desirable, however, to have the via corresponding to a particular package terminal as close as possible to the package terminal for signal quality purposes. For a package having a dense terminal array, it may be very difficult to avoid having a via directly opposite a corresponding power terminal while still making sure that the power terminal is as close as possible to the corresponding via.

Referring to FIG. 3, another approach to addressing this issue is to relocate the power bondpads on the integrated circuit die 105 to avoid having them opposite the vias. This solution, however, further limits the flexibility of the integrated circuit designer and the package designer in terms of how to bond out the integrated circuit die 105. Specifically, several power connections are typically required for each integrated circuit die and it may not be straightforward to ensure that each of the power bondpads is located in a position on the integrated circuit die such that it is not directly opposite a via. Further, for some cases, a signal bondpad may be rendered unusable if there is not enough room on the package substrate in which to place a corresponding bondfinger due to the placement of the power bondpads.

While a power bus bondring and associated vias on a BGA package are described above, other types of bondrings that include vias on other types of packages may present similar issues when bonding out an integrated circuit die.

SUMMARY OF THE INVENTION

An integrated circuit device package is described. The integrated circuit device package includes a package substrate and a conductive bondring disposed on the package substrate. The bondring has a via that is electrically coupled to the bondring. A conductive bondring extension is disposed on the package substrate. The bondring extension is electrically coupled to the bondring and the via and extends away from the bondring and the via.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A method and apparatus for electrically connecting a bondwire to a bondring near a via is described. In the following description, a ball grid array (BGA) package is shown and described for purposes of illustration. It will be appreciated by those skilled in the art that alternative embodiments are applicable to other types of packages that use any type of bondring or similar connection structure.

An intended advantage of one or more embodiments described below is to provide for an integrated circuit die to be bonded out to a bondring at any location around a bondring including an area of the bondring in which a via is formed. In this manner, one embodiment provides an integrated circuit device package designer with additional flexibility for routing connections from an integrated circuit die to a package substrate.

For one embodiment, an integrated circuit device package includes a package substrate on which a bondring is disposed. The bondring includes one or more vias to electrically connect the bondring to one or more corresponding terminals on an opposite side of the package substrate. A bondring extension to which a bondwire can be bonded is also disposed on the package substrate. The bondring extension is electrically coupled to the bondring and extends away from the bondring past an adjacent via. In this manner, a bondpad that is opposite a via can be electrically coupled to the bondring while avoiding the adjacent via.

Figure 1:
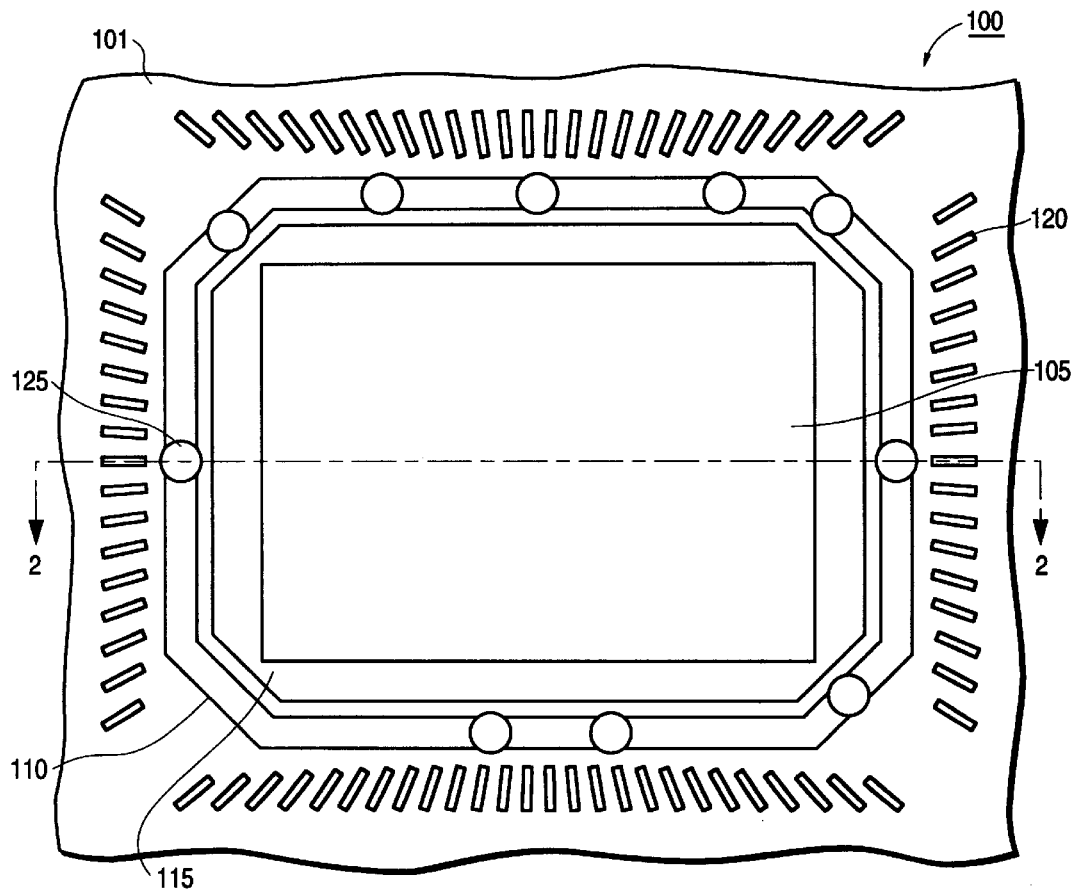
FIG. 1 is a partial top view of a prior integrated circuit device package and integrated circuit die.
Figure 2:
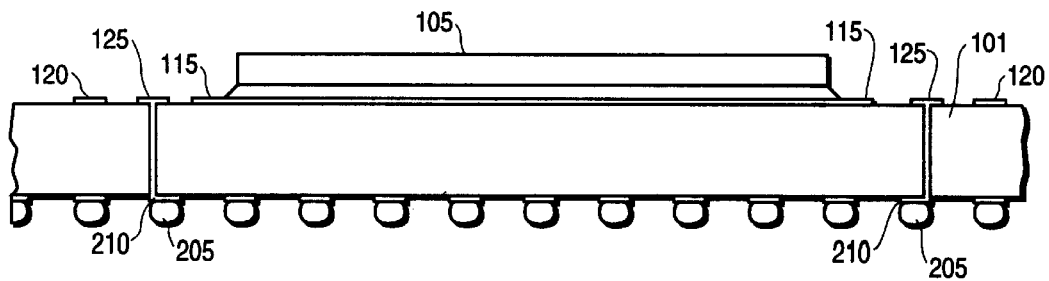
FIG. 2 is a partial cross-section of the integrated circuit device package and integrated circuit die of FIG. 1.
Figure 3:
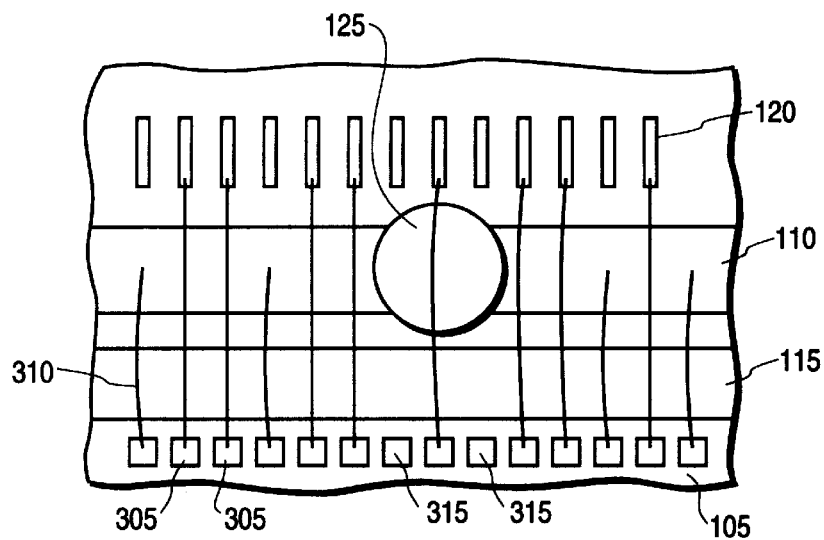
FIG. 3 is a partial overhead view of a portion of the integrated circuit device package and integrated circuit die of FIG. 1 in more detail.
Figure 4:
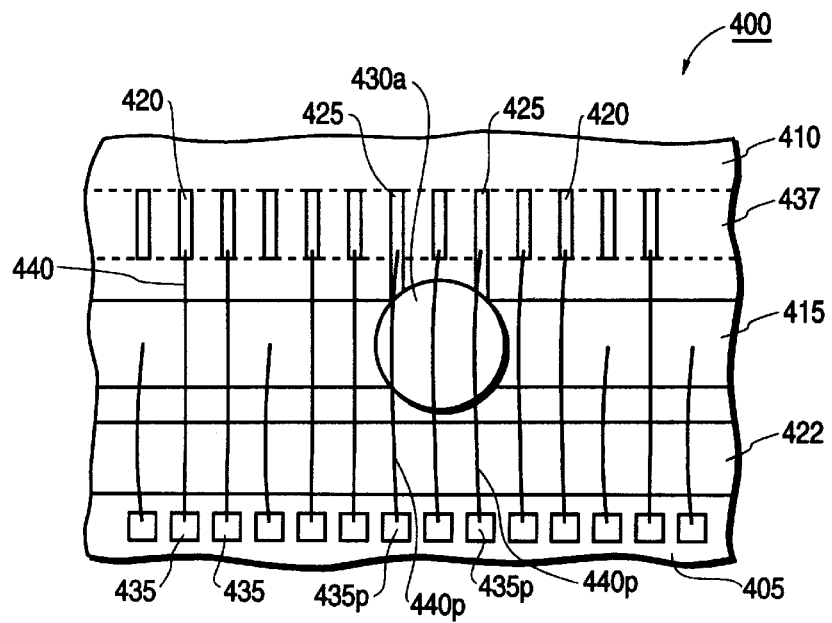
FIG. 4 is a partial overhead view of a portion of an integrated circuit die mounted on an integrated circuit device package of one embodiment.

FIG. 4 is partial top view of a portion of a ball grid array (BGA) integrated circuit device package 400 including an integrated circuit die 405 mounted on a package substrate 410. The integrated circuit die 405 is mounted on the package substrate 410 using a conventional or other die attach process.

A bondring 415 and signal bondfingers 420 are disposed on the substrate 410. Each of the signal bondfingers 420 is electrically isolated from the bondring 415. The bondring 415 and bondfingers 420 of one embodiment are formed using conventional lithographic techniques. For example, the bondring 415 and bondfingers 420 may be formed of copper that is deposited on the substrate, patterned, etched and plated with gold and/or nickel. For another embodiment, the bondring 415 and bondfingers 420 may be formed of different materials using a different process.

For the embodiment shown in FIG. 4, the bondring 415 is a power bondring, however other types of bondrings such as a ground bondring, for example may also be used in accordance with other embodiments.

Figure 5:
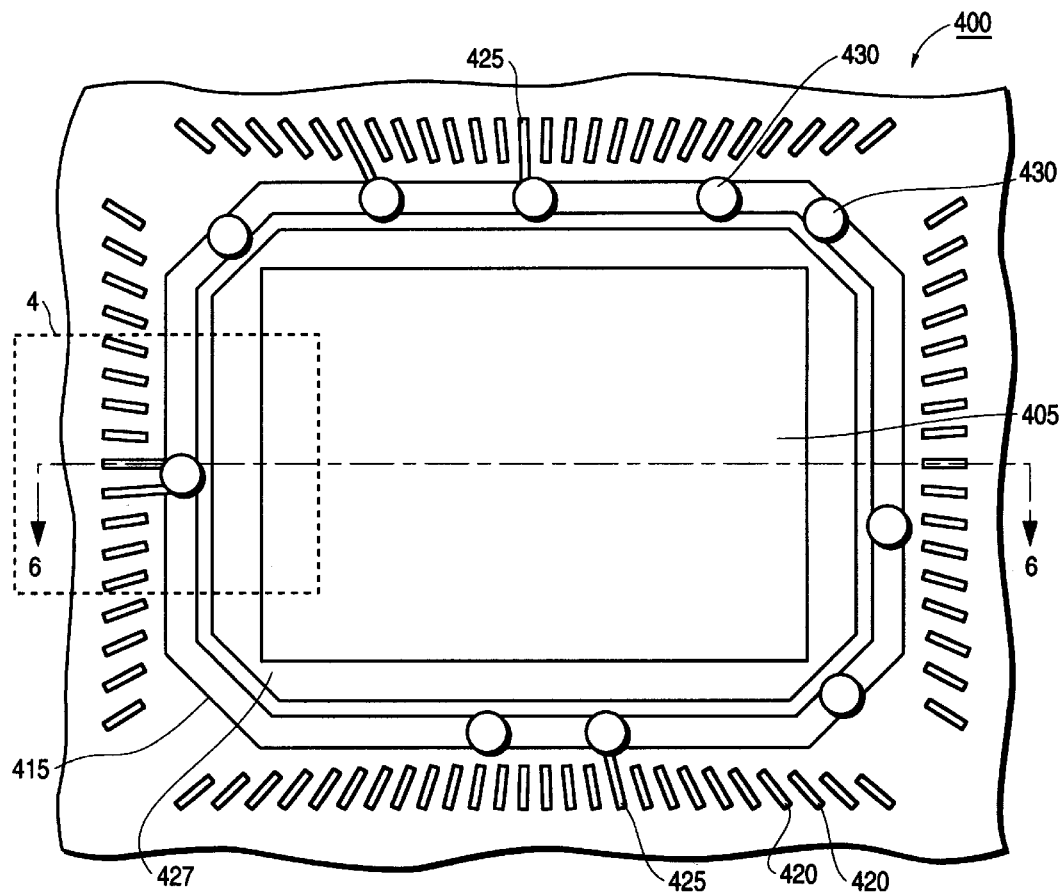
FIG. 5 is a partial overhead view of a portion of an integrated circuit die mounted on an integrated circuit device package of an alternate embodiment.

FIG. 5 is another top view showing a larger portion of the package 400 including the package substrate 410 and integrated circuit die 405. Bondwires 440 have not been shown in FIG. 5 for purposes of clarity.

The enclosed dotted line 4 indicates the portion of the package substrate 410 and integrated circuit die 405 shown in FIG. 4. A ground paddle 427 is shown extending from beneath the integrated circuit die 405. For other embodiments, a different approach may be used to provide ground connections to an integrated circuit die.

As shown in FIG. 5, the power bondring 415 of one embodiment extends around the perimeter of the integrated circuit die 405. In this manner, a power bondpad anywhere on the integrated circuit die 405 can be easily bonded out to the power bondring 415. Although the bondring 415 of FIGS. 4 and 5 extends around the entire perimeter of the die 405, for other embodiments, the bondring may include breaks or may extend around only a portion of an integrated circuit die.

The bondring 415 is electrically coupled to one or more terminals (shown in FIG. 6) on an opposite side of the package substrate 410 by vias 430. The number of vias 430 provided to electrically connect the bondring 415 to corresponding terminals may depend on factors such as the number of available corresponding terminals and/or the number of connections from the die 405 to the bondring 415, for example. For some embodiments, a single via may be used.

Each of the vias 430 of one embodiment is formed by drilling a hole through the package substrate 410 and filling the hole with a conductive material. Each of the vias 430 is thereby electrically coupled to the bondring 415 on a first surface of the package substrate 410. Each of the vias 430 is also electrically coupled to a corresponding terminal on an opposite surface of the package substrate 410 as described in more detail below with reference to FIG. 6. For other embodiments, other methods may be used to form the vias 430.

Referring again to FIG. 4, the integrated circuit die 405 includes bondpads 435. The bondpads 435 are contact areas on the integrated circuit die 405 through which signals are transferred to and from the integrated circuit die 405 during operation. Power bondpads 435p are provided to receive a supply voltage from a power terminal (not shown in FIG. 4).

The power bondpads 435p cannot be directly coupled to the power bondring 415 because of the location of the via 430a. The via 430a is directly opposite the power bondpads 435p such that a bondwire from either of the power bondpads 435p to the power bondring 415 would need to be bonded out at an angle to avoid the via 430a. Bonding the bondpads 435p out using bondwires at an angle large enough to avoid the via 430a (and a predetermined "keep out" space beyond the via 430a for manufacturing tolerance) would reduce the distance between the corresponding bondwires and adjacent bondwires. This could cause some of the bondwires to be shorted together or lead to other quality issues during encapsulation or other subsequent manufacturing steps.

To address this problem, for one embodiment, bondring extensions 425 are provided. Bondring extensions 425 may also be referred to as bondring bondfingers, or bond extensions, for example. Each of the bondring extensions 425 is formed of a conductive material that is electrically coupled to the bondring 415 and to the adjacent via 430a. The bondring extensions 425 of one embodiment are formed in a similar manner to the bondring 415 and the bondfingers 420.

Each of the bondring extensions 425 extends away from the bondring 415 and the via 430a. Although the bondring extensions 425 each, at least partially, contact the via 430a, for other embodiments, bondring extensions may be provided that do not directly contact the adjacent via, but are still electrically coupled to the adjacent via. This may be the case, for example, if a bondring extension is provided in the keep out area around the adjacent via. Also, for one embodiment, the bondring extensions 425 extend into the bondfinger region 437 that includes the signal bondfingers 420.

The power bondpads 435p that are opposite from vias 430 cannot be directly bonded out to the power bondring 415 due to the location of the via 430a as described above (wherein the via 430a is considered to include the physical via and the keep-out space provided for manufacturing tolerance). Bondwires 440p from the power bondpads 435p that are opposite vias 430 can, however, each be bonded to a corresponding bondring extension 425. Each of the bondwires 440p extends from one of the power bondpads 435p to one of the bondring extensions 425. Thus, for one embodiment, a bondpad that is opposite a via on a bondring can be electrically coupled to the bondring using a bondring extension.

Figure 6:
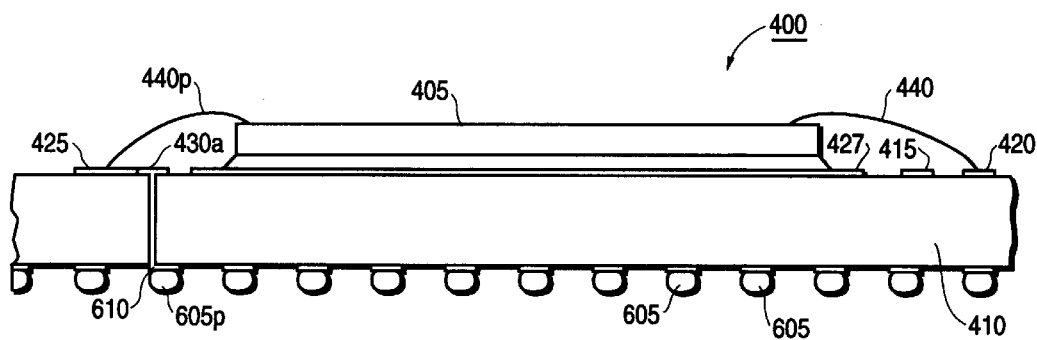
FIG. 6 is a cross-section of the integrated circuit die and integrated circuit device package of FIG. 5 taken at the line 6—6.

FIG. 6 shows a cross-section of the partial package 400 of FIG. 5 taken at the line 6—6. The cross-section of FIG. 6 includes bondwires 440 shown in FIG. 4 that are not shown in FIG. 6 for purposes of clarity. Also, the cross-section of FIG. 6 may include vias and other features that are not shown in FIG. 6.

As shown in FIG. 6, terminals 605 are disposed on a surface of the package substrate 410. The terminals 605 of the package 400 are solder balls, however other types of terminals such as solder columns, pins, solder-coated polymer balls and land pads, for example, may also be used for various embodiments. The terminals 605 include a power terminal 605p to which a supply voltage is coupled during operation of the integrated circuit die 405.

As discussed above with reference to FIG. 5, each of the bondwires 440p electrically couples a corresponding power bondpad 435p in the vicinity of a via 430 (FIG. 4) to a corresponding bondring extension 425. Each of the bondring extensions 425 is electrically coupled to the bondring 415 and/or to a via 430 that couples the bondring 415 to a corresponding terminal. As shown, the via 430 a extends through the package to a conductive terminal pad 610 that is electrically coupled to the power terminal 605p.

For other embodiments, the bondring extensions may extend away from the bondring in a different direction or at a different angle. Also, for other embodiments a different type of bondring and/or a different number of bondring extensions and/or vias and corresponding terminals may be provided. Further, for other embodiments, the vias may extend to another layer of a package substrate and/or may be coupled to additional conductive areas between the via and a corresponding terminal.

The embodiments described above provide the advantage that a power or other connection from an integrated circuit die to a bondring on a package substrate can be made at any location on the bondring including an area in which a via is provided. This provides circuit and package designers with additional flexibility in terms of placement of corresponding terminals and bondpads. In this manner, additional bondwires may be used for power connections, for example, to increase the electrical performance of an integrated circuit device package that includes the package substrate.

Also, again using a power connection as an example, a power bondwire can be very close to a corresponding power terminal. Keeping the power bondwire in close proximity to the corresponding power terminal helps to improve signal quality. Signal quality is improved because the size of the current loop from power to ground is small as compared to longer signal routing and therefore inductance is reduced. Reduced inductance helps to reduce noise, overshoot, and undershoot, for example. Other types of connections may benefit in a similar manner.

In the foregoing specification, the invention has been described with reference to specific exemplary embodiments thereof. It will, however be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit device package comprising:
    a package substrate;
    a conductive bondring disposed on the package substrate, the bondring having a via electrically coupled to and extending through the bondring; and
    a conductive bondring extension disposed on the package substrate, the bondring extension being electrically coupled to the bondring and the via, the bondring extension extending away from the bondring and the via.

2. The integrated circuit device of claim 1 wherein the bondring is a power bondring and the bondring extension is a power bondring extension.

3. The integrated circuit device package of claim 1 further including one or more signal bondfingers disposed on the package substrate and electrically isolated from the bondring, the one or more signal bondfingers being arranged in a bondfinger region around the bondring, wherein the bondring extension extends into the bondfinger region.

4. The integrated circuit device package of claim 1 further including
    an integrated circuit die mounted to the package substrate, the integrated circuit die including a bondpad opposite a portion of the via, and
    a bondwire extending from the bondpad and bonded to the bondring extension to electrically couple the bondpad to the bondring.

5. The integrated circuit device package of claim 4 wherein the bondpad is a power bondpad and the bondring is a power bondring.

6. An integrated circuit device comprising:
- an integrated circuit device package including
  - a package substrate,
  - a conductive bondring disposed on the package substrate,
  - a via extending from the bondring through a portion of the package substrate, the via being electrically coupled to the bondring, and
  - a conductive bondring extension extending away from the bondring and the via, the conductive bondring being electrically coupled to the bondring and the via; and
- an integrated circuit die mounted on the package substrate, the integrated circuit die having a bondpad opposite a portion of the via, the bondpad being bonded out to the bondring extension to electrically couple the bondpad to the bondring.

7. The integrated circuit device of claim 6 wherein the bondring is a power bondring and the bondpad is a power bondpad.

8. The integrated circuit device of claim 6 wherein the bondring is a ground bondring and the bondpad is a ground bondpad.

9. The integrated circuit device of claim 6 wherein the package is a ball grid array package.

10. The integrated circuit device of claim 6 wherein the bondring extends around a perimeter of the integrated circuit die.

* * * * *

UNITED STATES PATENT AND TRADEMARK OFFICE
CERTIFICATE OF CORRECTION

PATENT NO. : 6,020,631
DATED : February 1, 2000
INVENTOR(S) : Mozdzen.

It is certified that error appears in the above-identified patent and that said Letters Patent is hereby corrected as shown below:

In column 5, at line 3, delete "415" and replace with --435--.

Signed and Sealed this

First Day of May, 2001

*Attest:*

NICHOLAS P. GODICI

*Attesting Officer*   Acting Director of the United States Patent and Trademark Office